United States Patent [19]
Lee

[11] Patent Number: 5,998,070
[45] Date of Patent: Dec. 7, 1999

[54] MASK PATTERN

[75] Inventor: Jun Seok Lee, Seoul, Rep. of Korea

[73] Assignee: LG Semicon Co., Ltd., Chungcheongbuk-Do, Rep. of Korea

[21] Appl. No.: 09/057,531

[22] Filed: Apr. 9, 1998

[30]     Foreign Application Priority Data

Sep. 29, 1997 [KR]  Rep. of Korea ............................ 49797

[51] Int. Cl.$^6$ ...................................................... G03F 9/00
[52] U.S. Cl. ............................................................... 430/5
[58] Field of Search ............................... 430/5, 322, 324; 364/488

[56]              References Cited

U.S. PATENT DOCUMENTS 5,273,850  12/1993  Lee et al. ...................................... 430/5

OTHER PUBLICATIONS

Chris Spence, et al.; "Automated Determination of CAD Layout Failures Trough Focus"; SPIE vol. 2197; pp. 302–313; Jan. 1994.

Tohru Ogawa et al.; "Challenges to depth–of–focus enhancement with a practical super–resolution technique"; SPIE vol. 2726; pp. 34–35; Feb. 1996.

Young–Beom Kim et al.; "Study on optical proximity correction of Bit Line Pattern in DRAM devices"; SPIE vol. 2726; pp. 670–679.

*Primary Examiner*—S. Rosasco
*Attorney, Agent, or Firm*—Morgan, Lewis & Bockius LLP

[57]            ABSTRACT

A mask pattern useful for preventing the pattern distortion caused by light transition is disclosed, including a transmissive substrate; a first light-shielding line pattern formed to have an oblong form on the transmissive substrate; second and third light-shielding line patterns of an oblong form spaced apart from a long side of the first light-shielding line pattern and having a width of narrower than a width of edge portions of the first light-shielding line pattern, wherein a space at right to the side of the first light-shielding line pattern is formed between the second and third light-shielding line patterns; and a concave region formed at the long side of the first light-shielding line pattern facing the space between the second and third light-shielding line patterns.

23 Claims, 8 Drawing Sheets

MASK PATTERN

BACKGROUND OF THE INVENTION

1. Field of the Invention

The present invention relates to mask patterns and, more particularly, to mask patterns useful for preventing the pattern distortion caused by light transition.

2. Discussion of the Related Art

Development of semiconductor chips, i.e., integrated circuits, has been achieved with technology of the process for micro circuits. Also, due to high packing density and high performance of semiconductor devices, complex structures for semiconductor devices have been introduced. As a result, technology of forming micro patterns in a semiconductor device is highly demanded.

The development in the processing technology of minute patterns has enabled many circuits to be integrated in a given chip area so that heightened packing density and capacitance are brought about and delay time is reduced. Consequently, processing ability is improved.

In 1950s when semiconductor chips were first developed, the micro circuits-processing technology produced 15 $\mu$m chips. Currently, chips of submicron of less than 0.5 $\mu$m are commonly used. In addition, chips having a line width of less than 0.35 $\mu$m are commonly used.

Through the development of the micro circuits-processing, a packing intensity of chips has been doubled for every two years. This trend gets accelerated.

Lithography technique is basic in process for micro circuits. This technique is classified into photo lithography, electron beam lithography, and X-ray lithography.

Generally in case a design rule is more than 0.7 $\mu$m, a g line photo stepper having an output wavelength of 436 nm is used. In case of sub-micron lithography technology, an I-line photo stepper having an output wavelength of 365 nm is used. In case of a lithography technology of less than a sub-micron lithography technology, used is an excimer stepper using PSM (phase shift mask) with shifting a light phase by 180 degrees is used. Optical proximity correction mask (OPC) is being considered as a very reliable technology. In this technology, the distortion of an optical lens is corrected, and an original mask pattern is distorted in a direction opposite to the direction of the distortion of a lens. That is, a complementary auxilary pattern is additionally added to each corner of a general mask pattern in order to correct the distortion of a lens.

This technology has an advantage that, since an OPC mask includes a light-shielding layer and a transmitting layer in comparison with a PSM, low production cost, good delivery, and good effectiveness are realized.

Such a conventional mask pattern will be described with reference to the accompanying drawings.

FIG. 1A is a layout of a conventional pattern mask, FIG. 1B illustrates areal image distribution obtained by computer-simulating the mask pattern of FIG. 1A, and FIG. 1C is a graph of distance vs. intensity of light transmitting through the mask pattern of FIG. 1.

As shown in FIG. 1A, a first light-shielding line pattern 2 having a predetermined width is formed on a transmissive substrate 1, and second and third light-shielding line patterns 3 and 4 facing each other are spaced apart from the first light-shielding line pattern 2. Oblong is the center portion C of the first light-shielding line pattern 2 where a center portion C and both edge portions $E_1$ and $E_2$ are defined. The edge portions $E_1$ and $E_2$ are diagonally connected with the center portion C, and are in symmetry to each other. The second and third light-shielding line patterns 3 and 4 have an oblong form at right angle to one long side $D_1$ of the first light-shielding pattern line 2. At this time, the space between the second and third light-shielding line patterns 3 and 4 is designated a first space 6 which is at right angle to the long side $D_1$ of the first light-shielding line pattern 2. That is, the second and third light-shielding line patterns 3 and 4 are oblong in the direction of the space. Fourth light-shielding line patterns 5a and 5b are formed at outer long sides of the second and third line patterns 3 and 4, respectively. And fourth light-shielding line patterns 5a and 5b are spaced apart from the second and third light-shielding line patterns 3 and 4, respectively, by third spaces 8a and 8b, respectively. Short sides $D_2$ of the second and third light-shielding line patterns 3 and 4 face the long side $D_1$ of the first light-shielding line pattern 2. The space between the sides $D_1$ and $D_2$ is designated a second space 7. The second space 7 horizontally formed is at right angle to the first and second spaces 6 and 8a and 8b. In this case, the ratio of the width $W_1$ of the first light-shielding line pattern 2 and the width of each of the first, second, and third spaces 6, 7, and 8a and 8b is 2:1.5.

The second and third light-shielding line patterns 3 and 4 are formed to have a width that is almost close to the width $W_1$ of the first light-shielding line pattern 2. The aforementioned first light-shielding line pattern 2 is used as a mask pattern for patterning gate electrodes.

A conventional mask pattern is a binary mask including a transmissive substrate 1 having almost 100% transmitivity rate and first, second, third, and fourth light-shielding line patterns 2, 3, 4, and 5a and 5b made of a light-shielding material such as chrome. Thus it is advantageous for production cost, delivery, effectiveness, etc.

Referring to FIGS. 1B and 1C, the result of computer simulation and the graph of distribution of light intensity vs distance of the conventional mask pattern shown in FIG. 1a will be described.

In condition that the ratio of the width $W_1$ of the first light-shielding line pattern 2 shown in FIG. 1A and the width of the first, second, and third spaces 6, 7, and 8a and 8b is 2:1.5, the continuous line, shown in FIG. 1B, indicates an image contour having the same width as the critical dimension (CD) of the first, second, and third light-shielding line patterns 2, 3 and 4. An alternate long and short dash line 12 and an alternate long and two short dashes line 13 and dotted line 14 indicate overexposure. The image contours of the alternate long and short dash line 12 and the alternate long and two short dashes line 13 and the dotted line 14 have light distribution of less than 0.7 which is not related with the resolution of photo resist film (not shown) in the light distribution according to light intensity shown in FIG. 1C. That is, in order that the photo resist film reacts to the exposure light, light having intensity corresponding to 0.7–1 in Y axis should be exposed.

In the aforementioned condition, the peak point in exposing light using first, second, and third mask patterns 2, 3, and 4 is not placed at the center portion A between the first light-shielding line pattern 2 and the second and third light-shielding line patterns 3 and 4, yet moves to sides $D_2$ of the second and third light-shielding line patterns 3 and 4. Thus the moved peak point A' is at the sides $D_2$ of the second and third light-shielding line patterns 3 and 4.

In other words, among peak points of light transmitting through the first, second, and third spaces 6, 7, and 8a and 8b, the peak point between the first space 6 and the side $D_1$ of the first light-shielding line pattern 2 is not placed at 2/D, "A" that is the center of the side $D_1$ of the first light-shielding line pattern 2 and the edge portion $D_2$ of the second and third light-shielding line patterns 3 and 4 facing the side $D_1$. But it is placed at "A'". It is because the compensation for light transmitting through the first and third spaces 6 and 8a and 8b corresponding to the side $D_1$ of the first light-shielding line pattern 2 is caused.

Referring to FIG. 1B, as the result of the peak point shift, a convex portion "B" is formed at a place corresponding to the first space 6 among the side $D_1$ of the first light-shielding line pattern 2 in the areal image distribution. Also, the areal image distribution passing through the corners of the second and third light-shielding line patterns 3 and 4 adjacent to the peak point A' by influencing the corners of the second and third light-shielding line patterns 3 and 4 causes proximity effect of increasing the rounding errors, so that it is difficult to pattern desired forms when a photoresist film (not shown) is patterned with an exposure and development process using real mask patterns.

FIG. 2 is a layout of another conventional mask pattern, which looks similar to the mask pattern shown in FIG. 1A. Fourth light-shielding line patterns 5a and 5b formed beside the second and third light-shielding line patterns 3 and 4 formed at one long side of the first light-shielding line pattern 2 are formed to be connected to the second and third light-shielding line patterns 3 and 4, respectively. Accordingly, the third spaces 8a and 8b shown in FIG. 1A don't exist in FIG. 2.

Referring to FIG. 2, a first light-shielding line pattern 22 having a predetermined width is formed on a transmissive substrate 21. Second and third light-shielding line patterns 23 and 24 are formed at one long side of the first light-shielding line pattern 22 and spaced apart from the first light-shielding line pattern 22.

The center portion of the first light-shielding line pattern 22 is designated C and its edge portions are $E_{21}$, and $E_{22}$. The center portion C has an oblong form. And the edge portions $E_{21}$ and $E_{22}$ are diagonally connected to the center portion C, and they are in symmetry to each other.

The second and third light-shielding line patterns 23 and 24 are formed at right angle to one side $D_{21}$ of the oblong center portion C of the first light-shielding line pattern 22. At this time, a first space 26 between the second and third light-shielding line patterns 23 and 24 is at right angle to the long side $D_{21}$ of the first light-shielding line pattern 22.

One side $D_{22}$ of each of the second and third light-shielding line patterns 23 and 24 faces the long side $D_{21}$ of the first light-shielding line pattern 22. And there is a second space 27 between the sides $D_{21}$ and $D_{22}$. The ratio of the width $W_{21}$ of the center portion C of the first light-shielding line pattern 22, the width $W_{22}$ of the second and third light-shielding line patterns 23 and 24, and the width of the first and second spaces 26 and 27 is 2:5:1.5. The first and second spaces 26 and 27 form a T shape.

The peak point of light in performing an exposure process using the conventional mask pattern moves to a direction opposite to the conventional mask pattern of FIG. 1A. That is to say, a light peak point is not at the very center portion between the sides $D_{21}$ and $D_{22}$, yet moves toward the first light-shielding line pattern 22. As a result, the contour of the side $D_{21}$ of the first light-shielding line pattern 22 corresponding to the first space 26 has a concave region (not shown) in performing an exposure process using the aforementioned mask pattern.

The areal image distribution of the aforementioned conventional mask pattern is obtained through experiment using FAIM that is a lithography simulator. The above described problem is generated in light source of less than g-line (436 nm) or I-line (365 nm).

Conventional mask patterns have the following problems Since the peak point of light moves, the CD width of light-shielding line patterns changes and the round error is generated in which the corners of the light-shielding line patterns are rounded, thus deteriorating the reliability of mask patterns in highly packed semiconductor device. Moreover, since the light distribution is uneven, adjacent patterns are distorted.

SUMMARY OF THE INVENTION

Therefore, the present invention is directed to a mask pattern that substantially obviate one or more of problems due to limitations and disadvantages of the related art.

An object of the invention is to provide a highly reliable mask pattern in which, in addition to light-shielding line patterns, an axillary pattern is formed expecting that the peak point of light moves, so that the peak point can be placed at a desired spot, thereby preventing light from being distorted.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the mask pattern includes a transmissive substrate; a first light-shielding line pattern formed to have an oblong form on the transmissive substrate; second and third light-shielding line patterns of an oblong form spaced apart from a long side of the first light-shielding line pattern and having a width of narrower than a width of edge portions of the first light-shielding line pattern, wherein a space at right to the side of the first light-shielding line pattern is formed between the second and third light-shielding line patterns a space; and a concave region formed at the long side of the first light-shielding line pattern facing the space between the second and third light-shielding line patterns.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 3A:
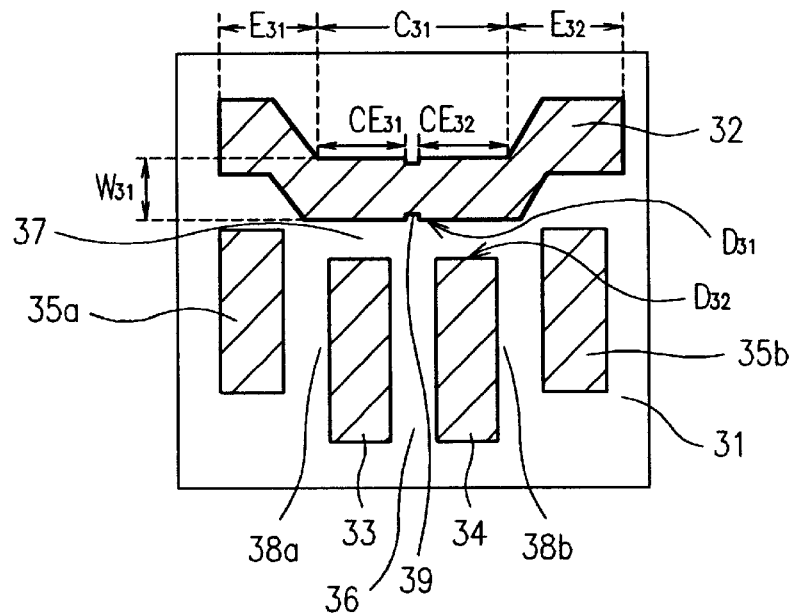
FIG. 3A is a layout of a mask pattern in accordance with a first embodiment of the present invention.
Figure 3B:
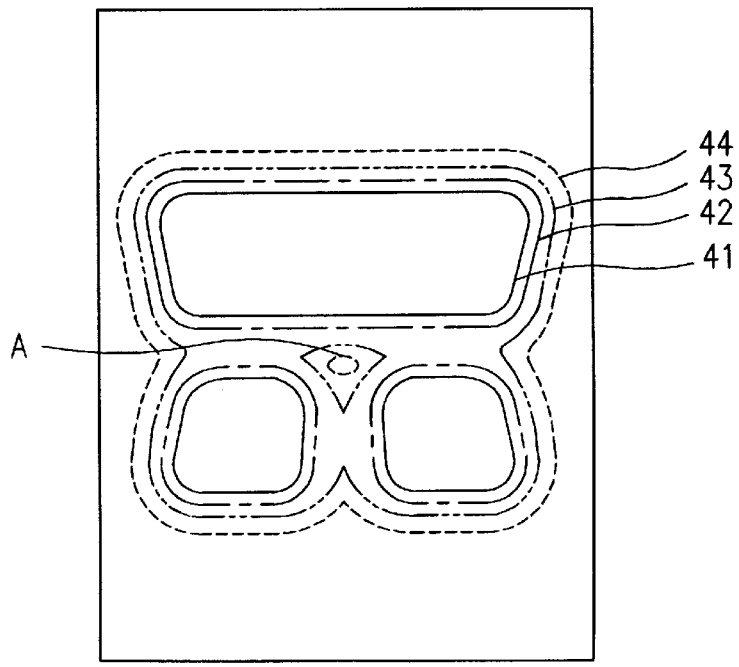
FIG. 3B illustrates areal image distribution obtained by computer-simulating the mask pattern of FIG. 3A in accordance with the first embodiment of the present invention.
Figure 3C:
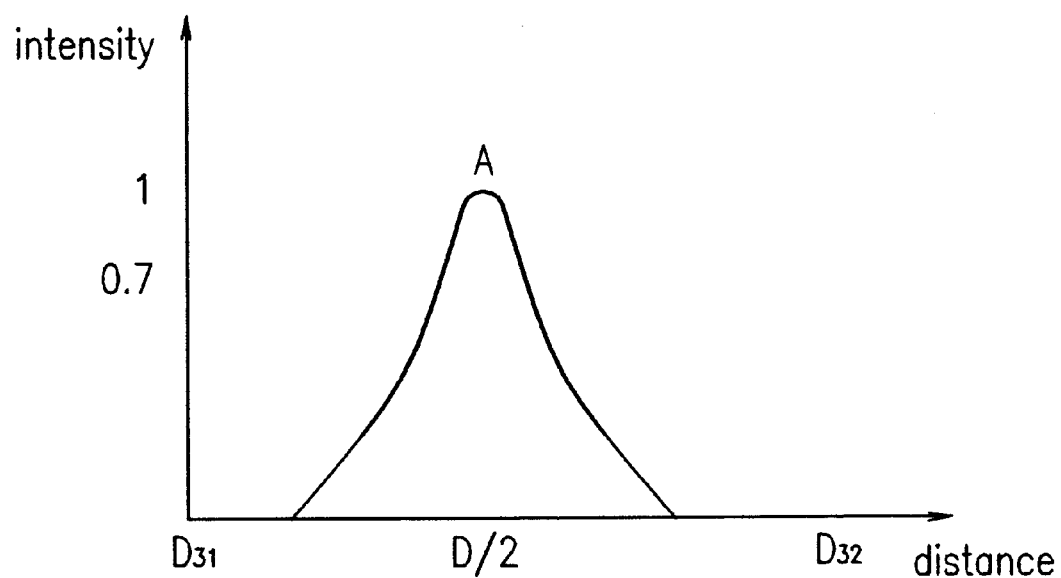
FIG. 3C is a graph of distance vs intensity of light transmitting through the mask pattern of FIG. 3A in accordance with the first embodiment of the present invention.

FIG. 3A is a layout of a mask pattern in accordance with a first embodiment of the present invention, FIG. 3B illustrates areal image distribution obtained by computer-simulating the mask pattern of FIG. 3A in accordance with the first embodiment, and FIG. 3C is a graph of distance vs intensity of light transmitting through the mask pattern of FIG. 3A in accordance with the first embodiment.

As shown in FIG. 3A, a first light-shielding line pattern 32 formed on a transmissive substrate 31 is defined as a center portion $C_{31}$ and first and second edge portions $E_{31}$ and $E_{32}$ which are symmetrical at the center of the center portion $C_3$. The first light-shielding line pattern 32 has a concave region 39 at a long side of the center portion $C_{31}$. Second and third light-shielding line patterns 33 and 34 are formed spaced apart from the long side of the first light-shielding line pattern 32, and have widths narrower than center portions $C_{31}$. A space at right angle to the first light-shielding line pattern 32 is formed between the second and third light-shielding line patterns 33 and 34.

At this time, the center portion $C_{31}$ excluding the concave portion 39 is defined as first and second center edges $CE_{31}$ and $CE_{32}$. And the space between the second and third light-shielding line patterns 33 and 34 as designated 25 a first space 36 corresponds to the concave region 39 of the first light-shielding line space 32.

The first and second edge portions $E_{31}$ and $E_{32}$ are diagonally connected to the center portion $C_{31}$ and are in symmetry to each other.

There is a second space 37 between one long side $D_{31}$ of the first light-shielding line pattern 32 facing the second and third light-shielding line patterns 33 and 34 and short sides $D_{32}$ of the second and third light-shielding line patterns 33 and 34.

Fourth light-shielding line patterns 35a and 35b are formed at outer long sides of the second and third light-shielding line patterns 33 and 34, respectively. Third spaces 38a and 38b are formed between the fourth light-shielding line patterns and the second and third light-shielding line patterns 33 and 34, respectively. The width of the second, third, and fourth light-shielding line patterns 33, 34, and 35a and 35b is similar or identical to the width $W_{31}$ of the first light-shielding line pattern 32.

This width is wider than 1.5 times of the shortest distance between the side $D_{31}$ and the side $D_{32}$. That is, the width of the second space 37 is in a range of $0.3\times(\lambda/N.A.)$–$0.75$ $(\lambda/N.A.)$. Herein, $\lambda$ is the wavelength of exposed light and N.A. is the numerical aperture of a lens.

The concave region 39 can have various sizes according to the conditions of exposure process using mask patterns including the concave region 39. For instance, the concave region 39 is formed to have a size of $0.2\times0.05$ $\mu$m in the long side×short side of the first pattern 32 if g-line of 436 nm is used as the wavelength of an exposed light, N.A. is 0.48, partial coherence is 0.7, the CD (critical dimension) of the first to fourth light-shielding line patterns 32, 33, 34, and 35a and 35b is 0.8 $\mu$m, and the width of the first to third spaces 36, 37, and 38a and 38b is 0.5 $\mu$m.

For another instance, the concave region 39 is formed to have a size of $0.15\times0.03$ $\mu$m in the long side×short side of the first pattern 32 if I-line of 365 nm is used as the wavelength of exposed light, N.A. is 0.63, partial coherence is 0.55, the CD (critical dimension) of the first to fourth light-shielding line patterns 32, 33, 34, and 35a and 35b is 0.4 $\mu$m, and the width of the first to third spaces 36, 37, and 38a and 38b is 0.25 $\mu$m.

This concave region 39 having a size of $0.2\times0.05$ $\mu$m or of $0.15\times0.03$ $\mu$m is a fine auxilary pattern having a size of less than the resolution limit so that real resolution is not affected. This is formed at a long side of the first light-shielding line pattern 32. This can be formed at the longitudinal side $D_{31}$ facing the first space 36, or two concave regions 39 can be formed at both the side $D_{31}$ and the other long side of the pattern 32.

Referring to FIGS. 3B and 3C, the result of the computer simulation of the mask pattern and a graph of light intensity vs distance according to the first embodiment of the present invention will be described below.

The areal image distribution of mask patterns according to the first embodiment is realized in the condition that the width $W_{31}$ of the first light-shielding line pattern 32 is bigger than 1.5 times of the width of the second space 37. The continuous line 41 is an image contour having an identical width with the CD of the first, second, and third light-shielding line patterns 32, 33, and 34 shown in FIG. 3A. The alternate large and short dash line 42 and the alternate large and two short dash line 43 and the dotted line 44 are contours showing over-exposure condition.

The peak point, when an exposure process is performed using mask patterns according to the first embodiment of the present invention, is made at the very center portion between the first light-shielding line pattern 32 and the second and third light-shielding line patterns 33 and 34. That is to say, the light transmitting through the first, second, and third spaces 36, 37, and 38a and 38b, as shown in FIG. 3A, generates a peak point along the very middle portion between $D_{31}$ and $D_{32}$ in the second and third light-shielding line patterns 33 and 34 corresponding to the first and second center edges $CE_{31}$ and $C_{32}$. Besides, a light peak is generated in the very center portion between the first light-shielding line pattern 32 and the second and third light-shielding line patterns 33 and 34. It is because of the concave region 39 placed in a predetermined area of center portion of the first light-shielding line pattern 32.

That is, compensation of the light transmitting through the concave region 39 is made at the overlapping region of the first light-shielding line pattern 32 and the second and third light-shielding line patterns 33 and 34, so that the peak point moves toward the side $D_{31}$ of the first light-shielding line pattern 32. The peak point, therefore, is formed at a position of D/2 that is the center portion between the first pattern 32 and the second and third patterns 33 and 34.

Figure 1A:
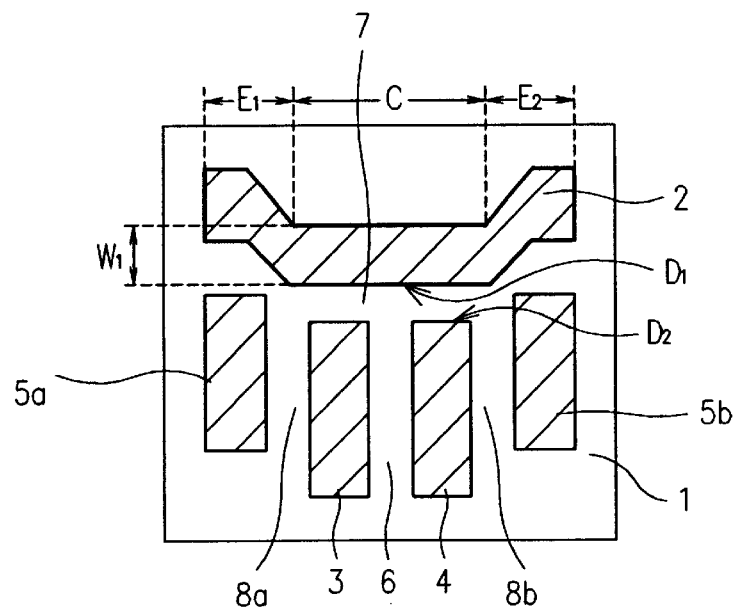
FIG. 1A is a layout of a conventional pattern mask.
Figure 1B:
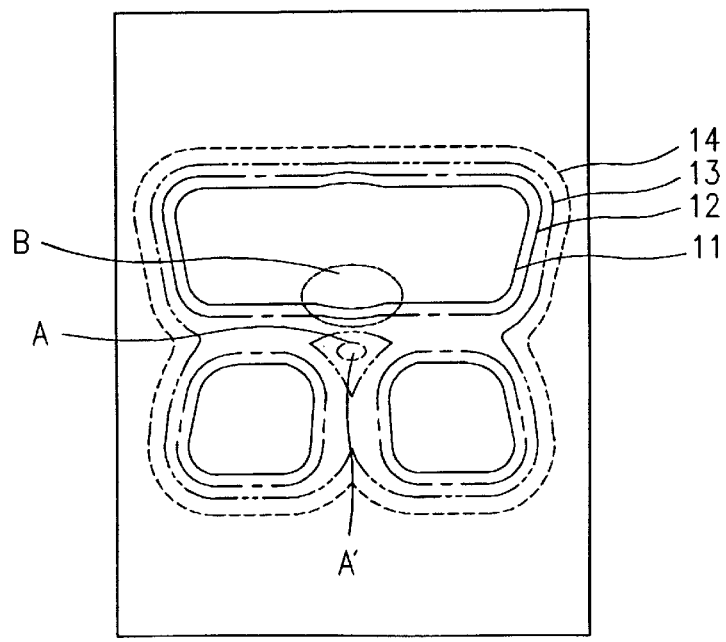
FIG. 1B illustrates areal image distribution obtained by computer-simulating the mask pattern of FIG. 1A.
Figure 1C:
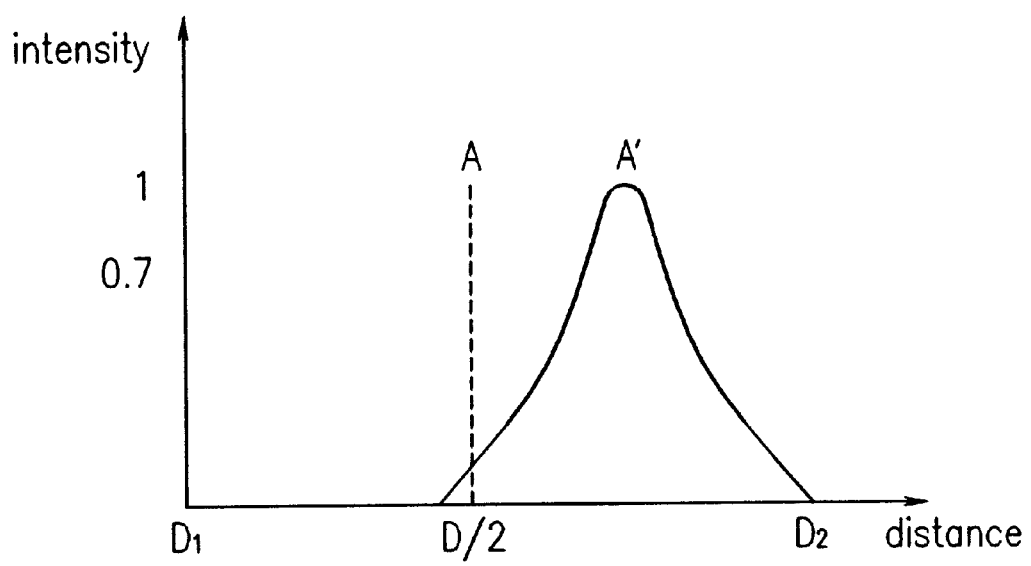
FIG. 1C is a graph of distance vs intensity of light transmitting through the mask pattern of FIG. 1.

Looking over the areal image distribution shown in FIG. 3B, it is consequently known that the light transmitting through the side $D_{31}$ of the first pattern 32 doesn't make convex portion corresponding to the first space 36, unlike the prior art of FIG. 1B. Since the peak point A is formed at the center portion, the corners of the second and third light-shielding line patterns 33 and 34 are not influenced, thus restraining the generation of proximity effect increasing round errors over the corners.

Figure 4A:
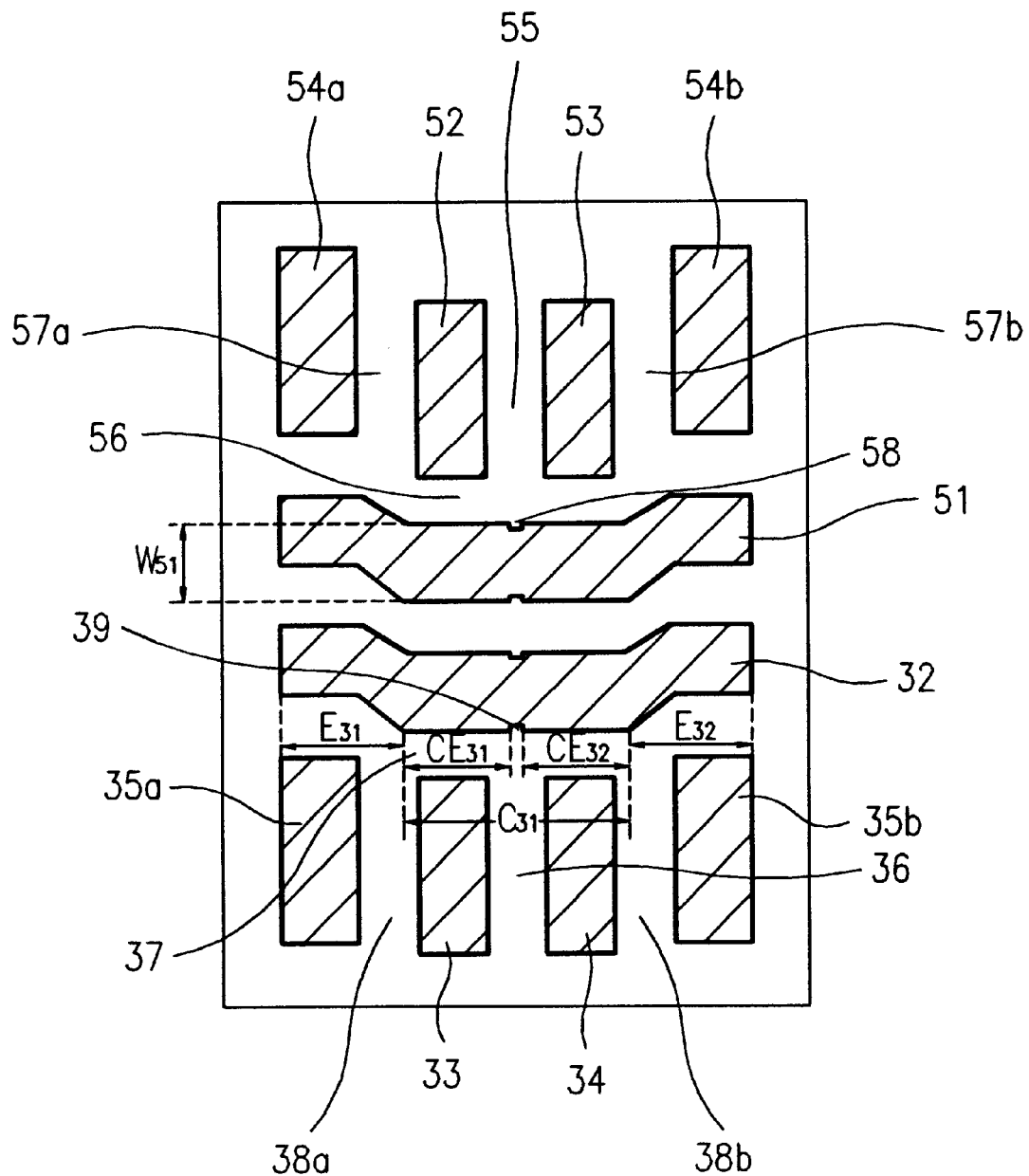
FIG. 4A is a layout of a mask pattern in accordance with a second embodiment of the present invention.
Figure 4B:
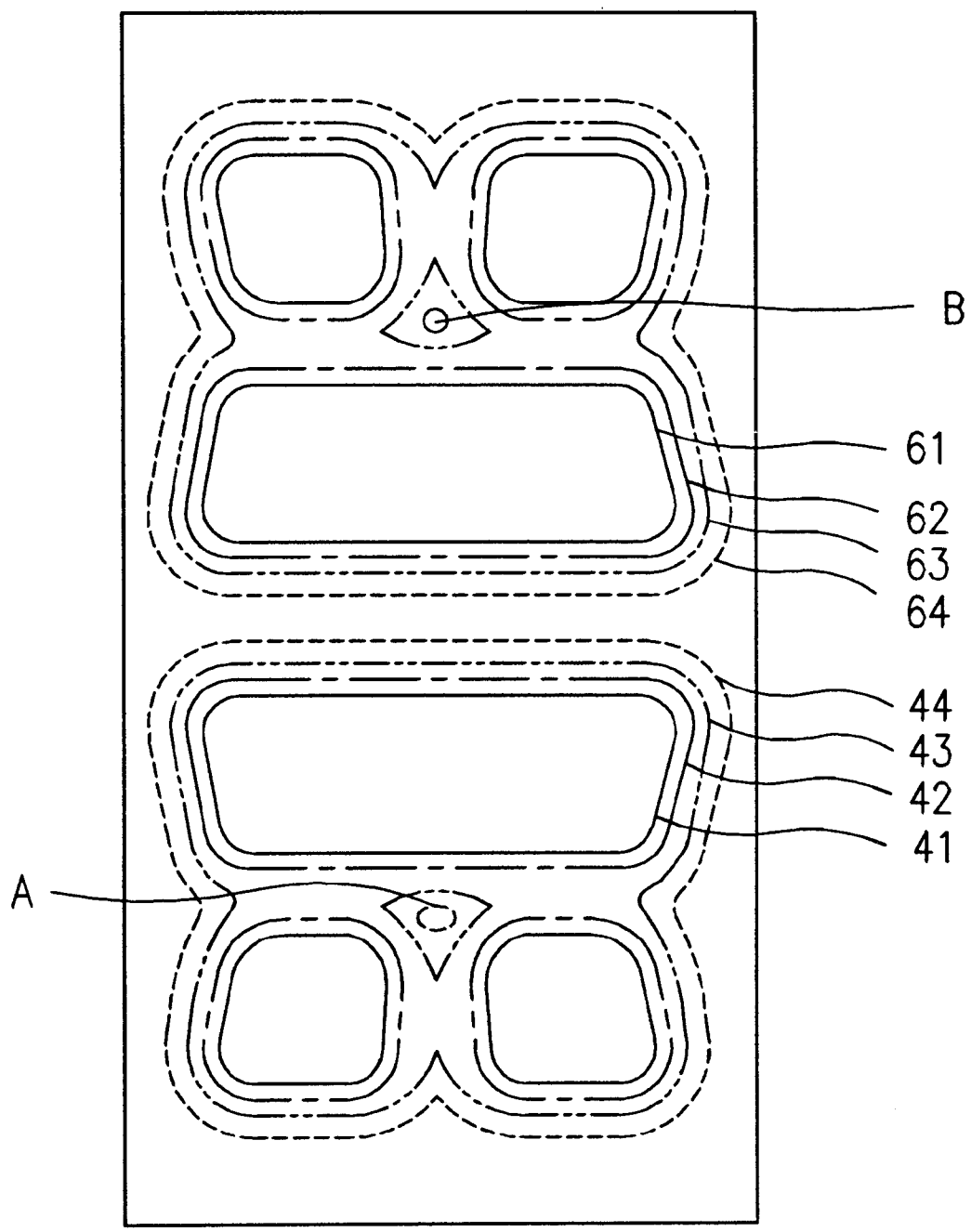
FIG. 4B illustrates areal image distribution obtained by computer-simulating the mask pattern of FIG. 4A in accordance with the second embodiment of the present invention.

FIG. 4A is a layout of a mask pattern in accordance with a second embodiment of the present invention, and FIG. 4B illustrates areal image distribution obtained by computer-simulating the mask pattern of FIG. 4A in accordance with the second embodiment.

The layout of a mask pattern made in accordance with the second embodiment is similar to that shown in FIG. 3A.

As shown in FIG. 4A, mask patterns similar to those made in accordance with the first embodiment are formed in predetermined areas of a transmissive substrate 31. Second and third light-shielding line patterns 33 and 34 are formed at one long side of a first light-shielding line pattern 32. A fifth light-shielding line pattern 51 is formed at the other long side of the first pattern 32. This fifth pattern 51 has an identical form with the first pattern 32 and is in parallel with the first pattern 32. Of course, the fifth pattern 51, like the first pattern 32, has concave regions 58 at identical sites.

The concave region formed at the first pattern 32 is designated a first concave region 39 and that at the fifth pattern 51 is designated a second concave region 58.

Sixth and seventh light-shielding line patterns 52 and 53 having shapes similar to the second and third light-shielding line patterns 33 and 34 are formed at one long side of the fifth pattern 51. The patterns 52 and 53 are at right angle with the fifth pattern 51. There is a fourth space 55 between the sixth and seventh light-shielding line patterns 52 and 53. There is a fifth space 56 between the fifth light-shielding line pattern 51 and the sixth and seventh light-shielding line patterns 52 and 53.

Eighth light-shielding line patterns 54a and 54b are formed at outer long sides of the sixth and seventh light-shielding line patterns 52 and 53, respectively, between which there exists a fourth space 55. At this time, the width $W_{51}$ of the fifth pattern 51 should be bigger than 1.5 times of the width of the fifth space 56. In details, the width of the fifth space 56 should be in a range of $0.3\times(\lambda/N.A.)$–$0.75\times(\lambda/N.A.)$. Herein, $\lambda$ is the wavelength of exposed light and N.A. is the numerical aperture of a lens.

Referring to FIG. 4B, the result of the computer simulation of mask patterns shown in FIG. 4A according to the second embodiment of the present invention will be described.

As shown in FIG. 4B, the areal image distribution of mask patterns according to the second embodiment has almost identical result with that of the first embodiment. At this time, the continuous line 61 shows the image contour having identical widths to the CDs of the fifth, sixth, and seventh light-shielding line patterns 51, 52, and 53. An alternate long and short dash line 62 and an alternate long and two short dashes line 63 and a dotted line 64 illustrate over-exposure condition.

When an exposure process is performed using mask patterns according to the second embodiment, a peak point is placed at a first center point A among the very center portion between the first light-shielding line pattern 32 and second and third light-shielding line patterns 33 and 34, and another peak point is placed at a second center point B among the very center portion between the fifth light-shielding line pattern 51 and the sixth and seventh light-shielding line patterns 52 and 53. It is because of the first and second concave regions 39 and 58 formed at both sides of the first and fifth light-shielding line patterns 32 and 51, respectively.

Figure 5A:
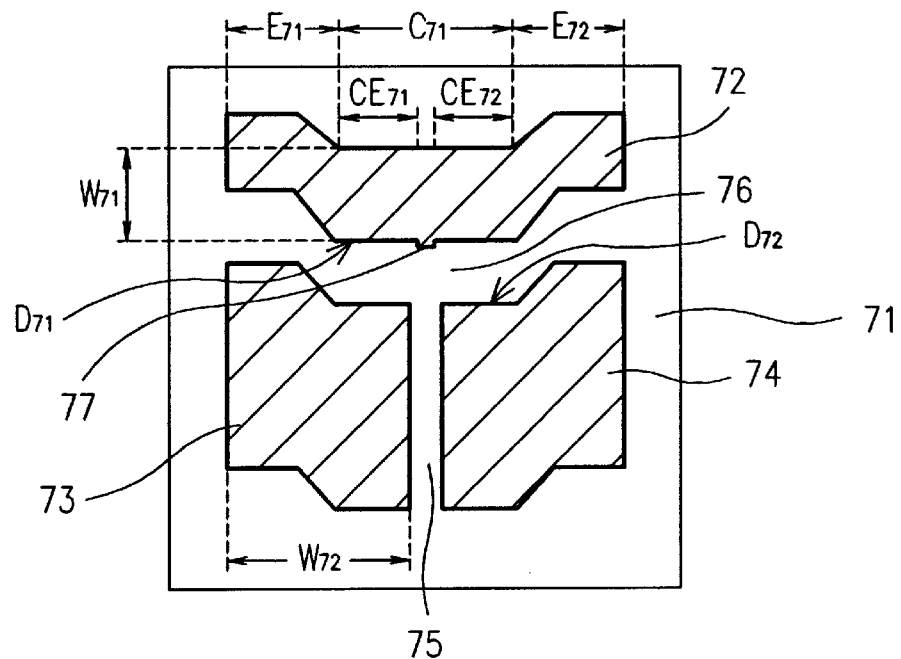
FIG. 5A is a layout of a mask pattern in accordance with a third embodiment of the present invention.
Figure 5B:
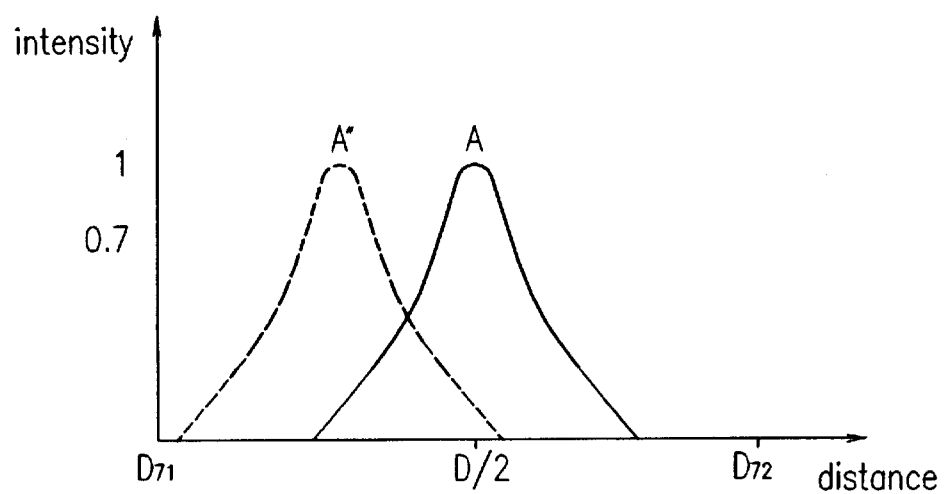
FIG. 5B is a graph of distance vs intensity of light transmitting through the mask pattern of FIG. 5A in accordance with the third embodiment of the present invention.

FIG. 5A is a layout of a mask pattern in accordance with a third embodiment of the present invention, and FIG. 5B is a graph of distance vs intensity of light transmitting through the mask pattern of FIG. 5A.

The layout of mask patterns according to the third embodiment is very similar to that of the mask patterns shown in FIG. 3A according to the first embodiment. It is constructed according to the third embodiment that the fourth light-shielding line patterns 35a and 35b at both sides of the second and third light-shielding line patterns 33 and 34 formed at one long side of the first light-shielding line pattern 32 of the second embodiment are formed in connection with the second and third light-shielding line patterns 33 and 34.

As shown in FIG. 5A, a first light-shielding line pattern 72 formed on a transmissive substrate 71 is defined as a center portion $C_{71}$ and first and second edge portions $E_{71}$ and $E_{72}$. The edge portions $E_{71}$ and $E_{72}$ are symmetrical with each other. The center portion $C_{71}$ has a convex region 77 in a predetermined area thereof. The widths of the second and third light-shielding line patterns 73 and 74 are formed at right angle with the first pattern 72 to reach the ends of the first and second edge portions $E_{71}$ and $E_{72}$, respectively.

At this time, the center portion $C_{71}$ excluding the convex region 77 is defined as center edge portions $CE_{71}$ and $CE_{72}$ at both sides of the convex region 77.

There is a first space 75 between the second and third patterns 73 and 74. It is formed in the direciton of the projecting the convex region 77 of the first pattern 72. The first and second edge portions $E_{71}$ and $E_{72}$ are placed at a different position from the center portion $C_{71}$, and are diagonally connected to the center portion $C_{71}$. One long side $D_{71}$ of the first light-shielding line pattern 72 faces the second and third light-shielding line patterns 73 and 74. Sides $D_{72}$ of the second and third patterns 73 and 74 correspond to the side $D_{71}$. There exist a second space 76 between the sides $D_{71}$ and $D_{72}$.

At this time, the width $W_{72}$ of the second and third light-shielding line patterns 73 and 74 corresponding to the side $D_{71}$ of the first light-shielding line pattern 72 is formed to be wider than twice of the width $W_{72}$ of the first light-shielding line pattern 72. This width of the second space 76 is wider than 1.5 times of the width $W_{71}$ of the first light-shielding line pattern 72.

The peak point of light of the mask patterns formed according to the third embodiment is placed at D/2 that is the very center portion between the side $D_{71}$ of the first pattern 72 and the side $D_{72}$ of the second and third patterns 73 and 74. This is because light does not transmit due to the mask patten portion of the convex region 77.

Figure 2:
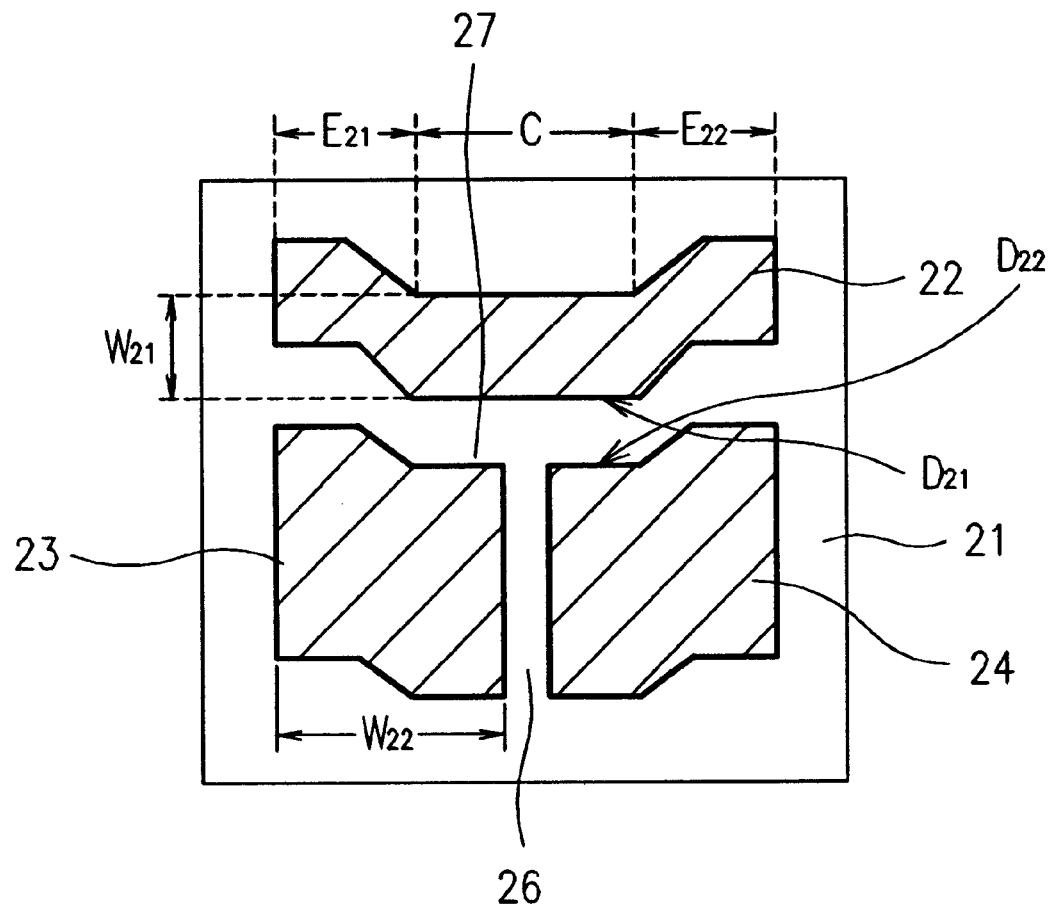
FIG. 2 is a layout of another conventional mask pattern.

While the light transmitting through mask patterns shown in FIG. 2 has a peak point at the spot A", the light transmitting through mask patterns according to the third embodiment is reduced at the convex region 77 so that a peak point moves in the direciton of the side $D_{72}$ of the second and third light-shielding line patterns 73 and 74, thereby being placed at the spot A.

Mask patterns of the present invention has the following advantages. Light intensity distribution can be made to be placed at the very center portion of mask patterns according to placements of the mask patterns, thereby improving reliability of highly packed semiconductor device. Further, since the light distribution becomes uniform, distortion of adjacent mask patterns can be prevented.

It will be apparent to those skilled in the art that various modification and variations can be made in the mask patterns of the present invention without departing from the spirit or scope of the inventions. Thus, it is intended that the present invention cover the modifications and variations of this invention provided they come within the scope of the appended claims and their equivalents.

What is claimed is:

1. A mask pattern comprising:
   a transmissive substrate;
   a first light-shielding line pattern having an oblong form on the transmissive substrate and having first, second, third, and fourth sides, wherein the first and second sides have a center portion and side edge portions, and the center portion of at least one of the first and second sides comprises a concave region, and the first and second sides are longer than the third and fourth sides;
   second and third light-shielding line patterns of an oblong form spaced apart from the second side of the first light-shielding line pattern and having a width narrower than a width of the side edge portions of the first light-shielding line pattern; and including
   a first space perpendicular to the second side of the first light-shielding line pattern between the second and third light-shielding line patterns;
   a second space in parallel with the second side of the first light-shielding line pattern between the first light-shielding line pattern and the second and third light-shielding line patterns,
   wherein the concave region faces the first space.

2. The mask pattern as claimed in claim 1, wherein the concave region is formed to have a size of less than resolution limit.

3. The mask pattern as claimed in claim 2, wherein both the first and second sides of the first light-shielding line pattern at the center portion have the concave region.

4. The mask pattern as claimed in claim 3, wherein the concave region has a dimension of 0.2×0.05 µm or of 0.15×0.03 µm.

5. The mask pattern as claimed in claim 1, wherein a width of the first light-shielding line pattern is formed to be wider than 1.5 times of the second space.

6. The mask pattern as claimed in claim 5, wherein the second space is in the range of 0.3×(λ/N.A.)–0.75×(λ/N.A.) where λ is a wavelength of exposed light and N.A. is a numerical aperture of a lens.

7. The mask pattern as claimed in claim 1, wherein the second and third light-shielding line patterns are formed to have the same width as the width of the first light-shielding line pattern.

8. The mask pattern as claimed in claim 1, wherein the side edge portions diagonally extend from the center portion of the first light-shielding line pattern.

9. The mask pattern as claimed in claim 1, further comprising fourth light-shielding line patterns formed at sides of the second and third light-shielding line patterns.

10. The mask pattern as claimed in claim 9, further comprising third spaces between the second and third light-shielding line patterns and the fourth light-shielding line patterns.

11. A mask pattern comprising:
    a transmissive substrate;
    a first light-shielding line pattern having an oblong form on the transmissive substrate and having first, second, third, and fourth sides, wherein the first and second sides have a center portion and side edge portions, and the center portion of at least one of the first and second sides comprises a first concave region, the first and second sides are longer than the third and fourth sides;
    second and third light-shielding line patterns formed at the second side of the first light-shielding line pattern to have a width narrower than a width of the side edge portions of the first light-shielding line pattern and spaced apart from the first light-shielding line pattern;
    a first space perpendicular to the second side of the first light-shielding line pattern formed between the second and third light-shielding line patterns;
    wherein the first concave region faces the first space between the second and third light-shielding line patterns;
    a fourth light-shielding line pattern having a shape substantially the same as the first light-shielding line pattern formed at the second side of the first light-shielding line pattern and spaced apart from the first light-shielding line pattern, wherein the fourth light-shielding line pattern has first, second, third, and fourth sides, and a center portion of at least one of the first and second sides comprises a second concave region;
    fifth and sixth light-shielding line patterns formed on the transmissive substrate at the first side of the fourth light-shielding line pattern;
    a second space perpendicular to the first side of the fourth light-shielding line pattern formed between the fifth and sixth light-shielding line patterns,
    wherein the second concave region faces the second space formed between the sixth and fifth light-shielding line patterns;
    a third space in parallel with the second side of the first light-shielding line pattern between the first light-shielding line pattern and the second and third light-shielding patterns; and
    a fourth space in parallel with the first side of the fourth light-shielding line pattern between the fourth light-shielding line pattern and the fifth and sixth light-shielding patterns.

12. The mask pattern as claimed in claim 11, wherein the fourth light-shielding line pattern is in parallel with the first light-shielding line pattern.

13. The mask pattern as claimed in claim 11, wherein the first and second concave regions are formed to have a size of less than resolution limit.

14. The mask pattern as claimed in claim 11, wherein both the first and second sides of the first and fourth light-shielding line patterns have the first and second concave regions, respectively.

15. The mask pattern as claimed in claim 14, wherein the first and second concave regions have a dimension of 0.2×0.05 µm or 0.15×0.03 µm.

16. The mask pattern as claimed in claim 11, wherein the width of the first and fourth light-shielding line patterns are 1.5 times greater than the third and fourth spaces.

17. The mask pattern as claimed in claim 11, wherein the third and fourth spaces are in the range of 0.3×(λ/N.A.)–0.75×(λ/N.A.) where λ is a wavelength of exposed light and N.A. is a numerical aperture of a lens.

18. The mask pattern as claimed in claim 11, wherein the second third, fifth, and sixth light-shielding line patterns have the same width as the first and fourth light-shielding line patterns.

19. A mask pattern comprising:

a transmissive substrate;

a first light-shielding line pattern having an oblong form on the transmissive substrate, and having first, second, third, and fourth sides, wherein the first and second sides have a center portion and side edge portions, and the second side at the center portion has a convex region, and the first and second sides are longer than the third and fourth sides;

second and third light-shielding line patterns formed at the second side of the first light-shielding line pattern to have a length longer than twice the width of the first light-shielding line pattern and spaced apart from the first light-shielding line pattern, a first space perpendicular to the second side of the first light-shielding line pattern between the second and third light-shielding line patterns, wherein the convex region formed at the second side of the first light-shielding line pattern faces the space between the second and third light-shielding line patterns; and including a second space in parallel with the second side formed between the first light-shielding line pattern and the second and third light-shielding line patterns.

20. The mask pattern as claimed in claim 19, wherein the convex region is formed to have a size of less than resolution limit.

21. The mask pattern as claimed in claim 20, wherein the convex region is formed to have a dimension of 0.2×0.05 $\mu$m or 0.15×0.03 $\mu$m.

22. The mask pattern as claimed in claim 19, wherein the width of the first light-shielding line pattern is 1.5 times greater than the second space between the long side of the first light-shielding line pattern and the adjacent second and third light-shielding line patterns.

23. The mask pattern as claimed in claim 19, wherein the second space is in the range of 0.3×($\lambda$/N.A.)–0.75×($\lambda$/N.A.) where $\lambda$ is a wavelength of exposed light and N.A. is a numerical aperture of a lens.

* * * * *